United States Patent [19]
Acosta et al.

[11] Patent Number: 5,781,607
[45] Date of Patent: Jul. 14, 1998

[54] MEMBRANE MASK STRUCTURE, FABRICATION AND USE

[75] Inventors: Raul Edmundo Acosta, White Plains; Raman Gobichettipalayam Viswanathan, Briarcliff Manor, both of N.Y.

[73] Assignee: IBM Corporation, Armonk, N.Y.

[21] Appl. No.: 731,536

[22] Filed: Oct. 16, 1996

[51] Int. Cl.⁶ .................................................. G21K 5/10
[52] U.S. Cl. ........................................ 378/34; 378/35
[58] Field of Search ......................... 378/34, 35; 430/5; 250/492.1, 491.1, 492.2, 492.22, 492.3

[56] References Cited

U.S. PATENT DOCUMENTS

| | | | |
|---|---|---|---|
| 4,587,184 | 5/1986 | Schneider-Gmelch et al. | 378/35 X |
| 5,111,491 | 5/1992 | Imai et al. | 378/35 |
| 5,115,456 | 5/1992 | Kimura et al. | 378/35 |
| 5,227,268 | 7/1993 | Koga et al. | |
| 5,235,626 | 8/1993 | Flamholz et al. | 378/34 |
| 5,459,001 | 10/1995 | Estes et al. | 378/35 X |
| 5,572,562 | 11/1996 | Rostoker et al. | 378/35 X |
| 5,593,800 | 1/1997 | Fukioka et al. | 378/35 X |

FOREIGN PATENT DOCUMENTS

| | | | |
|---|---|---|---|
| 4-240716 | 8/1992 | Japan | 378/35 |
| 4-294519 | 10/1992 | Japan | 378/35 |
| 4-315417 | 11/1992 | Japan | 378/35 |
| 2089524 | 6/1982 | United Kingdom | |

OTHER PUBLICATIONS

"X-Ray Exposure Mask", Patent Abstracts of Japan, Pub. No. 59002323, Jul. 01, 1984.

*Primary Examiner*—David P. Porta
*Attorney, Agent, or Firm*—Robert M. Trepp; Anne Vachon Dougherty

[57] ABSTRACT

A membrane mask structure for lithography using a radiation source and steps for fabricating and using the inventive membrane mask structure. The membrane mask structure comprises the following: a support structure formed of a material which is opaque to the lithographic radiation source and comprising support members separated by window areas; a membrane layer overlaying said support members and window areas, said membrane layer comprised of material which is transparent to said radiation source; and a pattern of feature material formed on or embedded in the membrane layer, said feature material being opaque to the radiation source and said feature pattern aligning with the window areas of said support structure. The mask structure may additionally include a plurality of reference markers formed in or on said membrane layer or on said support members of said support structure. In addition, the mask structure may include a protective pellicle of radiation-transparent material, which pellicle is mounted on the surface of said support members not associated with said membrane layer in such a way as to prevent any debris from contacting the membrane areas on which the feature pattern is formed.

33 Claims, 12 Drawing Sheets

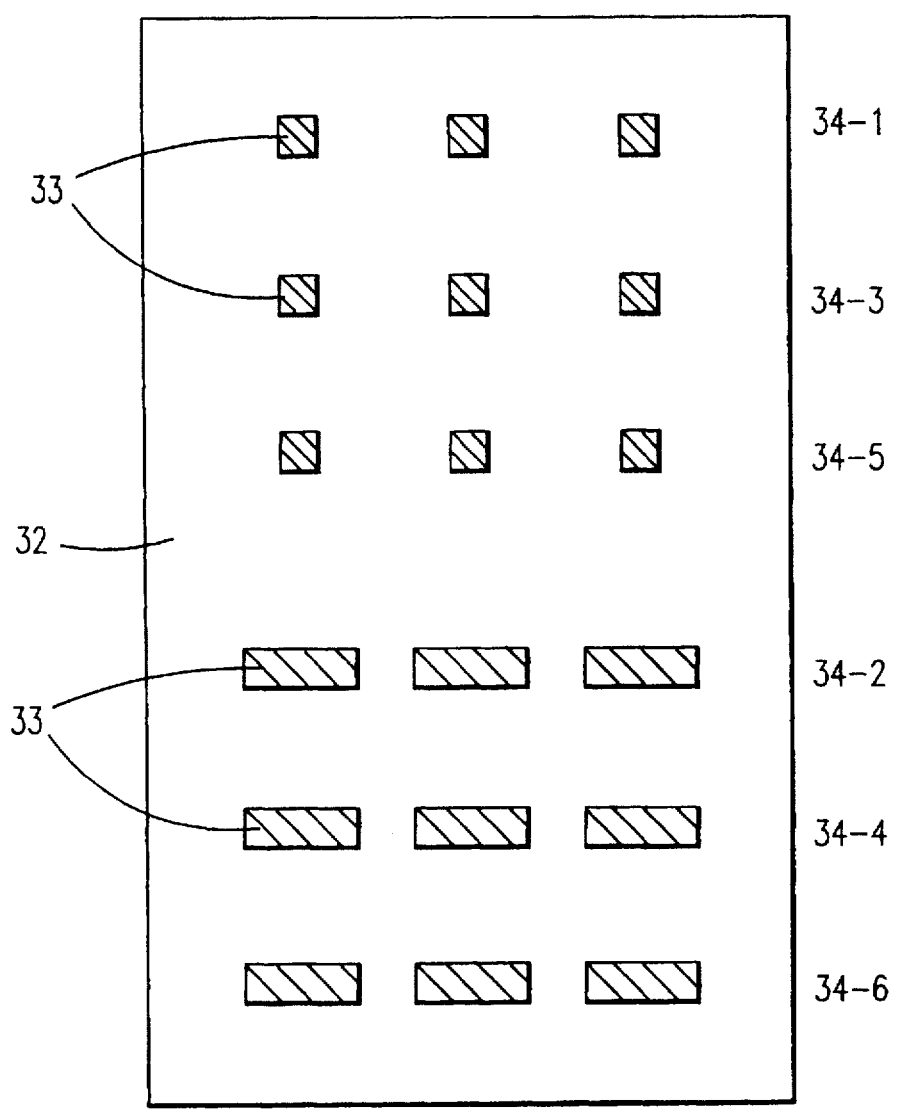

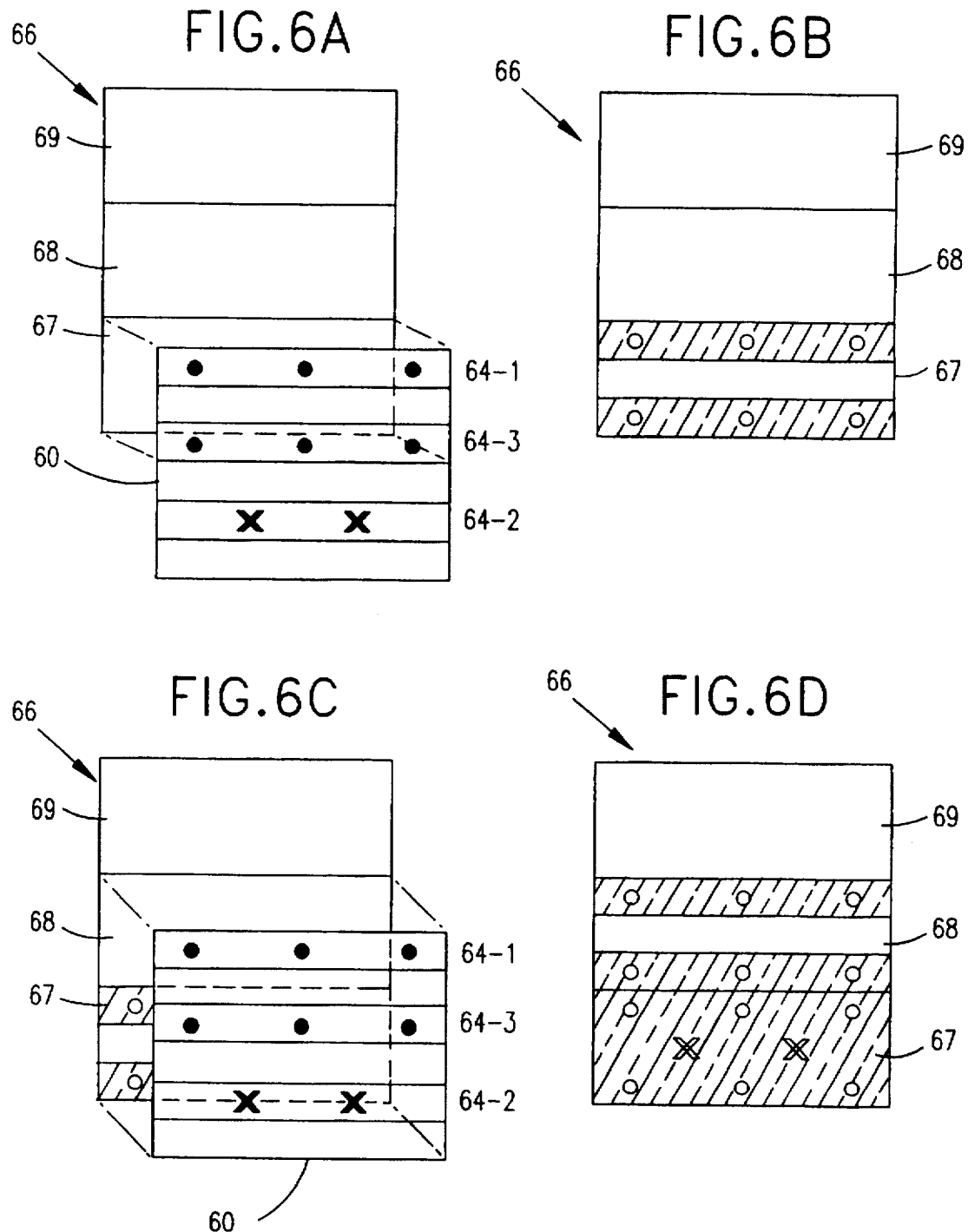

MEMBRANE MASK STRUCTURE, FABRICATION AND USE

The present invention was made with Government support under contract No. N 00019-94-C-0035 awarded by the Department of the Navy. The Government has certain rights in the present invention.

FIELD OF THE INVENTION

This invention relates generally to the fabrication of membrane mask structures for use in semiconductor manufacturing. More particularly, the invention provides novel membrane mask structures for use in x-ray and ion beam lithography, processes for fabricating the novel membrane mask structures, and a method for using the novel membrane mask structures.

BACKGROUND OF THE INVENTION

In semiconductor manufacturing, microlithography is employed to create the desired pattern of the integrated circuit in the semiconductor material. A radiation-sensitive layer of resist material is deposited on the semiconductive material and is subsequently irradiated by passing energy from a radiation source through a patterned mask in order to selectively expose areas of the resist layer. Additional processing of the exposed layer of resist material results in selective removal of the resist, leaving the desired pattern for formation of the integrated circuit. Still further device processing through the desired pattern may include steps of diffusion into the semiconductor material, deposition of materials onto the semiconductor material and further resist deposition, exposure, removal and processing.

In the industry today, the radiation sources of choice include high energy radiation sources such as electron beam radiation, ion beam radiation and synchrotron x-ray radiation. Critical to microlithographic processing using such radiation sources is the patterned mask through which the radiation passes. The mask must be fabricated of a material which is effectively inert to the type of radiation passing through it, as well as being inert to the processing conditions, including ambients, extreme temperatures and chemical exposures required for the post-processing. In addition, the masks must be fabricated to exacting standards in order to effect accurate transfer of the pattern to the semiconductor material. While the mask materials which are appropriate for each microlithographic process will differ depending upon the intended radiation source and attendant processing conditions, the need for well-defined and accurately placed mask features is constant. Moreover, as the size of individual semiconductor device features shrinks, the dimensions desired for very large scale integration (VLSI) on chips increases, with projected requirements for chips having dimensions in excess of 30 mm by the year 2000. Therefore, the lithographic masks must provide densely configured high resolution features accurately placed across a large patterned area, placing effectively conflicting demands on the mask materials. In order to detail both the current deficiencies in lithographic masks and to provide the framework for remedying such deficiencies in accordance with a preferred embodiment of the invention, this application will hereinafter specifically discuss the structure, fabrication and use of masks for x-ray lithography. It is to be understood that the invention can readily be applied to masks for ion-beam and other lithography using membrane masks in accordance with the teachings herein, with such modifications as will occur to one having skill in the relevant art and having read and understood the present invention.

X-ray masks, of the type illustrated as 10 in FIG. 1, comprise a substrate, 11, a thin membrane, 12 of dimension L and thickness $t_m$, which membrane is transparent to the x-ray radiation, and a pattern of absorber material, 13, of thickness $t_a$, which absorber material is chosen to absorb the x-ray radiation, thereby prohibiting the x-ray radiation from exposing the areas of the resist which are in alignment with the absorber pattern. Illustrative materials for an x-ray mask include silicon for substrate 11, silicon, silicon carbide, silicon nitride, diamond, etc. for membrane 12, and gold or refractory metals having high atomic numbers such as tungsten, tantalum, tantalum nitride, tantalum boride, etc. for the absorber material 13.

In fabricating an x-ray mask, the placement of the pattern of absorber material features 13 is critical. Errors due to drift, charging, temperature fluctuations, vibration effects, etc. during the writing of the absorber pattern on the membrane can result in pattern displacement which renders the mask unusable. In-plane distortion of the mask features arises largely due to the effect of the absorber stress on the membrane, which stress is proportional to a number of processing and materials variables. The absorber stress will arise in part due to the differences in the physical properties of the membrane and absorber materials, and in part due to the conditions encountered during deposition and patterning of the absorber (e.g., sputtering temperature during deposition, etc.).

In one currently used method for fabricating x-ray masks, the membrane 12 is formed by selective diffusion of a dopant into substrate 11 to thickness $t_m$, followed by etching out of the membrane area defined by dimension L, with the absorber pattern created subsequent to membrane formation. Another method involves deposition of the layer of material for membrane 12 onto substrate 11 followed by removal of the underlying substrate along dimension L prior to creation of the absorber pattern. Yet another mask fabrication process flow provides for wafer processing of the mask up to the point of creation of the absorber pattern, followed by back etching of the substrate wafer to form the membrane under the absorber pattern along dimension L. The absorber material may be formed on or embedded in the membrane. All of the foregoing process result in distortion of the mask pattern due to the stress placed by the absorber material on the membrane which is unsupported along dimension L. As previously noted, VLSI requirements which will increase the dimension L will create further challenges to pattern placement. The distortion due to absorber stress can additionally be exacerbated by post-processing temperature and chemical exposures.

Processing contributions to the absorber stress and resultant in-plane distortion will be magnified when processing large area membranes for the >30 mm chips. For example, while the stress of refractory metals is known to be dependent upon the temperature of the substrate during the sputtering process, it is extremely difficult to maintain a consistent temperature across a large membrane area during sputtering, whereby variations in the surface temperature during deposition will lead to variant stresses imposed by the absorber in different areas of the mask membrane. Non-uniformity of absorber stress can, in fact, be more detrimental than a high absolute value of stress on the membrane.

It has been found that the in-plane distortion in a mask is not only proportional to the absorber stress, but is also proportional to the dimension of the membrane, L, and the thickness of the absorber, $t_a$, and is inversely proportional to the Young's modulus of the membrane material as well as inversely proportional to the thickness of the membrane, $t_m$. Therefore, in addition to tailoring the choice of materials and the processing conditions in order to minimize distortion and absorber stress, efforts have been made to maximize the membrane thickness and minimize the absorber thickness to effect an overall reduction in the amount of in-plane distortion encountered in the x-ray masks, without otherwise adversely affecting the masks and use thereof (e.g., increased membrane thickness necessitates longer exposure times). While workable on x-ray masks of the dimensions currently encountered, the foregoing efforts will not be as effective on the large area masks which will be required for VLSI chip fabrication.

Yet another difficulty encountered when scaling a mask to the dimension envisioned (e.g., equal to or greater than 30 mm) is the inability to guarantee continual alignment while writing the mask features. For large area x-ray mask patterns, the e-beam writer has to proceed without reference to position markers which, coupled with the drift due to thermal effects, vibration, charging, etc. can lead to significant errors in pattern placement.

Finally, errors in pattern placement can arise during use of the lithographic mask due to temperature changes during exposure through the mask, due to vibration encountered when moving the membrane mask into position over the target chip sites on the semiconductor material to be patterned, due to debris deposited thereon during use, and due to the absorber pattern of the mask inadvertently coming into contact with the semiconductor surface. What is desirable is a membrane mask structure for which the fabrication processes and conditions of use introduce minimal error in terms of pattern placement.

Therefore, it is an objective of the invention to provide a membrane mask structure and fabrication technique whereby one can reduce absorber stress effects and in-plane distortion while providing a mask for achieving large area lithography of VLSI chips.

It is additionally an objective of the invention to provide a membrane mask structure having a plurality of registration markings to provide continual alignment during e-beam writing, thereby achieving intended pattern placement.

It is yet another objective of the invention to provide a lithographic membrane mask fabrication process and resulting structure wherein the mask pattern on the membrane is created at the wafer level, thereby avoiding the in-plane distortion problems which occur under the present processes of pattern formation on a thin membrane or back etching of the unsupported patterned wafer to form a membrane.

Still another objective of the invention is to provide a membrane mask structure for which the absorber pattern will not be subject to degradation during use due to temperature effects, vibrations effects, physical contact, or contact with debris.

SUMMARY OF THE INVENTION

These and other objectives are realized by the present invention which provides a two-stage mask having alternate areas of radiation-transparent membrane having opaque pattern features interleaved with opaque, support members. The membrane mask structure for lithography using a radiation source comprises the following: a support structure formed of a material which is opaque to the lithographic radiation source and comprising support members separated by window areas; a membrane layer overlaying said support members and window areas, said membrane layer comprised of material which is transparent to said radiation source; and a pattern of feature material formed on or embedded in the membrane layer, said feature material being opaque to the radiation source and said pattern aligning with the window areas of said support structure. The mask structure may additionally include a plurality of reference markers formed in or on said membrane layer or on said support members of said support structure. In addition, the mask structure may include a protective pellicle of radiation-transparent material, which pellicle is mounted on said support members in such a way as to prevent any debris from contacting the membrane areas at which the feature pattern is formed.

BRIEF DESCRIPTION OF THE DRAWINGS

FIGS. 3A and 3B provide top and cross-sectional views of the novel mask structure of the present invention.

FIGS. 6A through 6H illustrate use of the novel mask structure of FIGS. 3A and 3B.

DESCRIPTION OF THE PREFERRED EMBODIMENT

Figure 1:
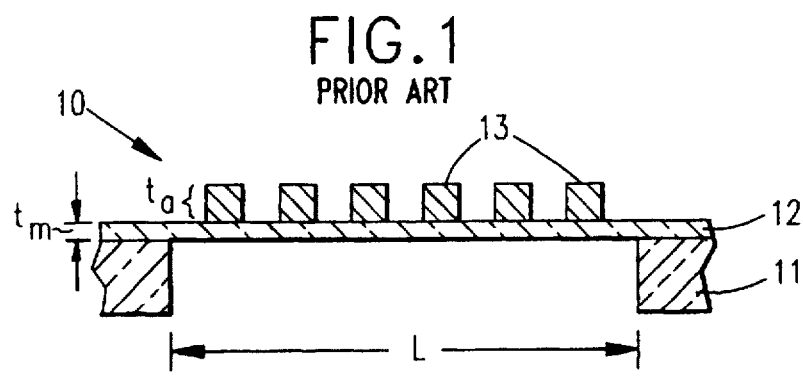
FIG. 1 provides a cross-sectional illustration of a prior art mask structure for use in semiconductor lithography.
Figure 2:
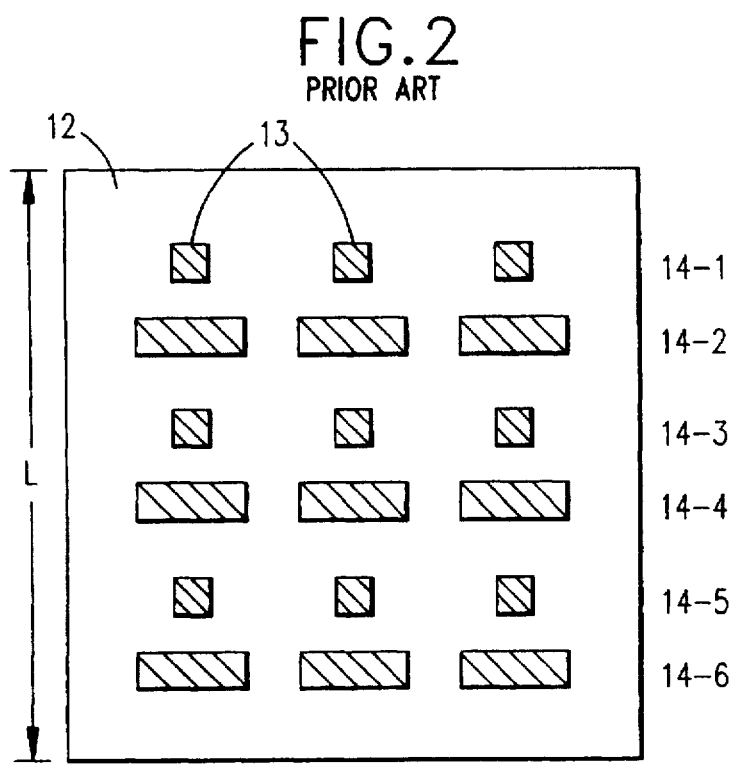
FIG. 2 provides a top view of a prior art mask having a desired pattern for transfer to a semiconductor wafer.

FIGS. 1 and 2 illustrate cross-sectional and top views, respectively, of a prior art lithographic mask for use in semiconductor manufacture. For the sake of clarity, the invention will be detailed with specific reference to x-ray mask materials and fabrication processes. As noted above, it is to be understood that the present invention applies to not only x-ray masks but also to ion beam mask structures and fabrication processes and such other appropriate membrane mask structures and fabrication processes as would readily occur to one having skill in the art and having access to the present teachings. Visible, from the top view of the prior art mask structure provided in FIG. 2, are the membrane, 12, and a pattern of absorbers, 13. The pattern of absorbers can be referred to as a pattern of rows of absorber features, labelled rows 14-1 through 14-6. In accordance with the prior art, the rows of absorber features, 14-1 through 14-6, are written onto the membrane, 12, along dimension L. The absorber features will, as discussed above, create stress on the membrane, causing in-plane shifting of the absorbers and warping of the membrane with attendant distortion of the pattern of absorbers.

Figure 3B:
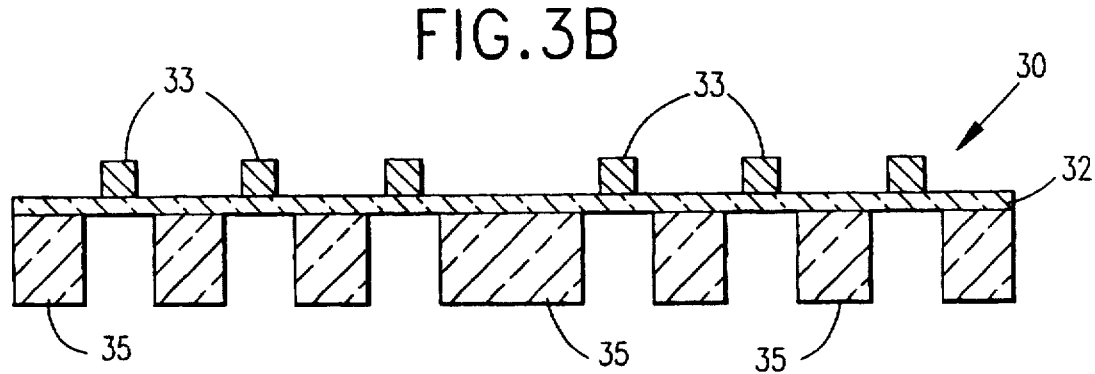

FIGS. 3A and 3B illustrate the top and cross-sectional views, respectively, of the novel mask structure wherein the membrane dimension L with rows 14-1 through 14-6 of FIGS. 1 and 2 has been divided. Like numerals (e.g., 13 and 33; 14-1 through 14-6 and 34-1 through 34-6) have been used to designate corresponding features in order to illustrate that the present inventive mask structures depicted in FIGS. 3A, 3B, 4, etc. can be utilized to effect transfer of the same mask pattern as had been transferred using the prior art mask shown in FIGS. 1 and 2. FIG. 3A shows the top view of membrane 32 having absorbers 33 provided thereon. The areas of the membrane 32 at which absorbers are formed represent rows of mask features, 34-1 through 34-6, which correspond to the rows of absorber features 14-1 through 14-6. Therefore, the pattern of absorbers in row 14-1 of FIG. 2 has the same absorber features as the pattern of absorber features in row 34-1; row 34-2 corresponds to row 14-2; and so forth. The even numbered rows of absorber features on the membrane have been sequentially provided in one area of the mask structure, while the odd numbered rows have been sequentially provided in a separate area of the mask. All rows have been separated by interleaved areas of the membrane having associated support members underlying the membrane in those areas, as further detailed with reference to FIG. 3B. It is, to be noted that the materials out of which the membrane 32 and absorbers 33 are fabricated are the same materials as have been used for x-ray masks in the past. The support members are illustrated as solid members, though any non-solid configuration (e.g., I-beam, honeycomb, etc.) would suffice provided that the support structure be opaque to the radiation and supply the requisite physical support.

Shown in cross-sectional FIG. 3B, underlying the membrane 32 in the areas between each of the rows 34-1 through 34-6, are support members 35 comprised of material which is not transparent to x-ray radiation. The support members act as shields to the radiation and as support structures between the rows 34-1 through 34-6 comprised of x-ray transparent membrane material and absorbers, and are generally of the same width as each of the rows. For the sake of discussion of the illustrated mask, for which dimension L has been divided into six equal horizontal segments, let L=6l, where l is the dimension of each row. The dimension of each support member is also 1 to insure that feature areas do not overlap with opaque areas during use of the mask. Between rows 34-5 and 34-2, separating the two stages of patterned rows, is an area of the support member which is equal to 2l, for the purposes of illustration as will be discussed in further detail with reference to use of the novel mask structure and FIG. 6, and the mask structure has an overall dimension of 12l or 2L.

While optimal for the sake of description of the invention, the foregoing relationship of dimensions can be varied without departing from the invention herein. For example, the support members may be separated by openings which are not uniform in dimension (e.g., one of dimension l and another of dimension l+0.25 mm) provided that the absorber pattern is separated by the windows of the same dimensions. The support members are fabricated of silicon, or other suitable material which is opaque to the radiation of choice. The silicon support members have been machined or etched to the appropriate configuration to accommodate the pattern of rows, 34-1 through 34-6, of the membrane, 32, with absorbers 33. The novel mask structure is, therefore, a multiple stage mask having alternate rows of membrane and absorbers interleaved with opaque support members. While the illustrated embodiment provides two stages, the mask pattern could be divided into more than two stages, with the number of required exposures increasing in direct correlation to the number of mask stages.

While the support members clearly will enhance the structural integrity of the mask structure during mask processing (discussed further below) and during use, it is primarily the reduction of the area of unsupported membrane for each row of the absorber pattern (i.e., decreasing dimension L for each section of membrane and absorbers) that results in a decrease in the effects of the absorber stress on the membrane in that area, thereby decreasing the likelihood of pattern distortion. It is conceivable, therefore, to decrease the effect of the absorber stress on pattern placement on a mask membrane by segmentation of the mask pattern as shown in FIG. 3A, without providing additional structural support, although the preferred mode for implementing the invention is to provide both segmentation and support. In addition to reducing the absorber stress effects, segmentation of the mask pattern will render the membrane mask less susceptible to the negative effects of temperature fluctuations and vibration during use.

Preferred minimum and maximum dimensions of the segments into which the mask pattern should be divided and the dimensions of the membrane areas and support members are constrained on the minimum end by the ability to provide small dimension slits in the support material (e.g., 1 mm using currently available technology), along with the need to maintain mechanical stability (i.e., support members are preferably providing support in addition to providing for separation of the mask pattern), and at the maximum end by the stated ends of reducing the effects of absorber stress and of temperature and vibration encountered in use (e.g., around 5 mm for x-ray membrane masks having the density of features currently encountered in the technology).

Figure 4A:
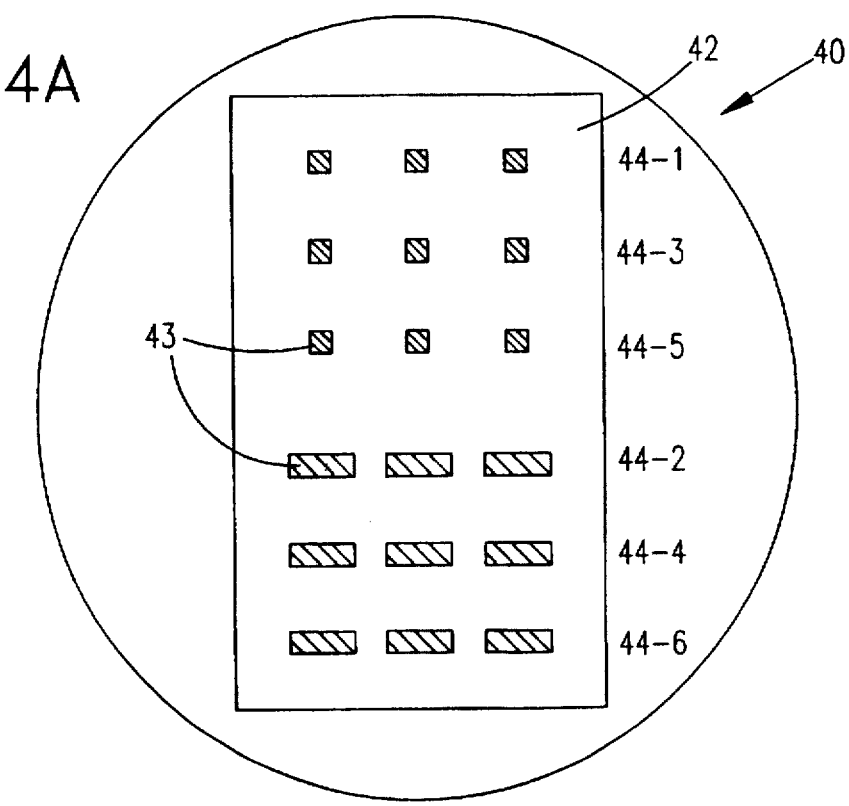
FIGS. 4A and 4B provide top views of the patterned wafer and the support structure wafer which comprise one embodiment of the novel mask structure.
Figure 4B:
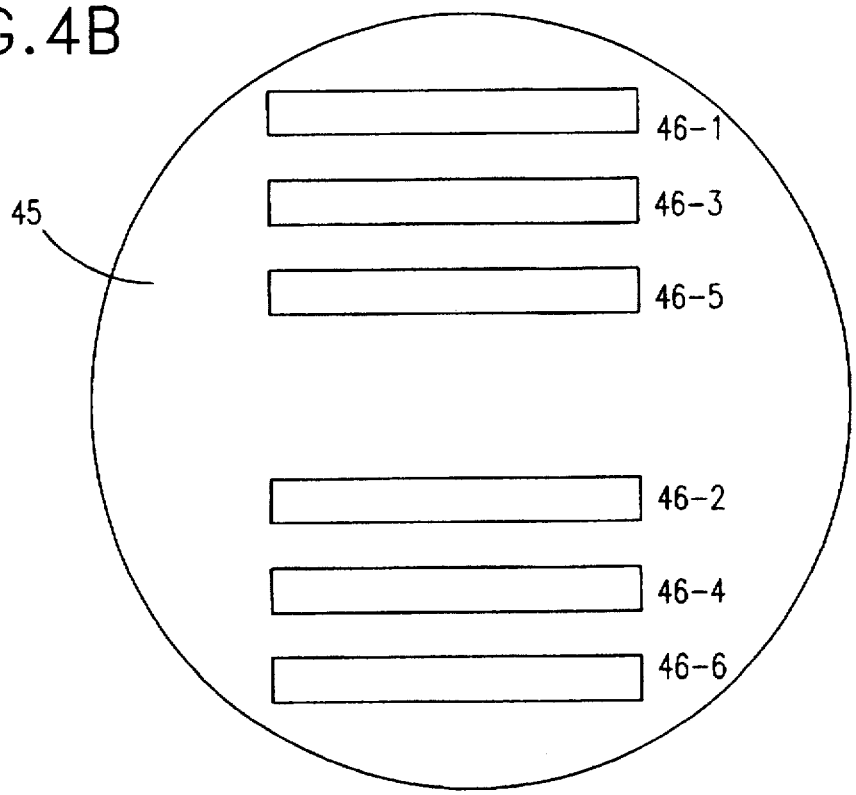

FIGS. 4A and 4B show top views of the two components which make up one embodiment of the inventive mask structure, mask wafer, 40, and support wafer, 45. In FIG. 4A, mask wafer, 40, comprises a substrate on which is deposited (or into which is diffused) membrane area, 42, having rows, 44-1 through 44-6, of absorbers, 43. The support wafer of FIG. 4B, silicon wafer, 45, has been machined or etched to have openings, 46-1 through 46-6, of the same dimensions as rows, 44-1 through 44-6. When support wafer, 45, is fastened to the mask wafer, 40, the openings, 46-1 through 46-6, are in alignment with rows, 44-1 through 44-6. The areas of support wafer, 45, which are located between openings, 46-1 through 46-6, comprise the support members, which were depicted at 35 of FIG. 3B. While it is possible to fabricate a plurality of individual support members to be placed between the rows of mask wafer, 40, it clearly is of the most practical use to provide an entire support wafer, 45, having the plurality of openings formed therein. Use of a support wafer will provide ease of alignment to the mask wafer, 40, which has the absorber pattern. It is contemplated at this time that machining of the silicon support wafer, 45, is the most advantageous fabrication process (e.g., milling, sandblasting, electron discharge machining), in terms of accuracy and economy. However, one having skill in the art will be aware that the pattern of openings in the wafer, 45, could be formed by chemical processes to achieve the same support structure. Similarly, one having skill in the art will realize that silicon is not the only material which can be used for the support structure, whether in piece or wafer format; but that a silicon wafer will be preferred given silicon's physical properties, the fact that silicon is the preferred membrane mask material, and the intended conditions of usage.

The thickness of the support wafer must minimally be the thickness at which sufficient structural integrity is maintained given the dimensions of the rows and openings. A maximum thickness would be dictated purely by practical considerations such as cost, machine tolerances, etc. It is also to be noted that the substrate, 41, could be made relatively thick so that it could act as the support structure onto which the membrane, 42, could be deposited (or into which could be diffused the appropriate dopant to form the layer of membrane material) followed by etching back of the substrate material to form the openings.

The support wafer, 45, is fastened to the mask wafer, 40, rather than simply placed in registration with the mask wafer. Fastening of the two wafers insures continued alignment of the support structure and the mask pattern when the mask structure is being used for lithography, particularly since movement of the mask structure is contemplated in accordance with the best mode for use of the invention as discussed with reference to FIG. 6. When using silicon, fastening can be achieved, for example, by anodic bonding, in which a layer of borosilicate glass is deposited onto the support wafer, and the support wafer and the mask wafer are brought together under conditions of high voltage and high temperature to effect the physio-chemical bond. Other methods of fastening include direct silicon bonding, screwing, and such other methods as would effect the locking of the two wafers with respect to each other to prevent shifting in the x-y plane without compromising the absorber and support structure features.

Figure 5A:
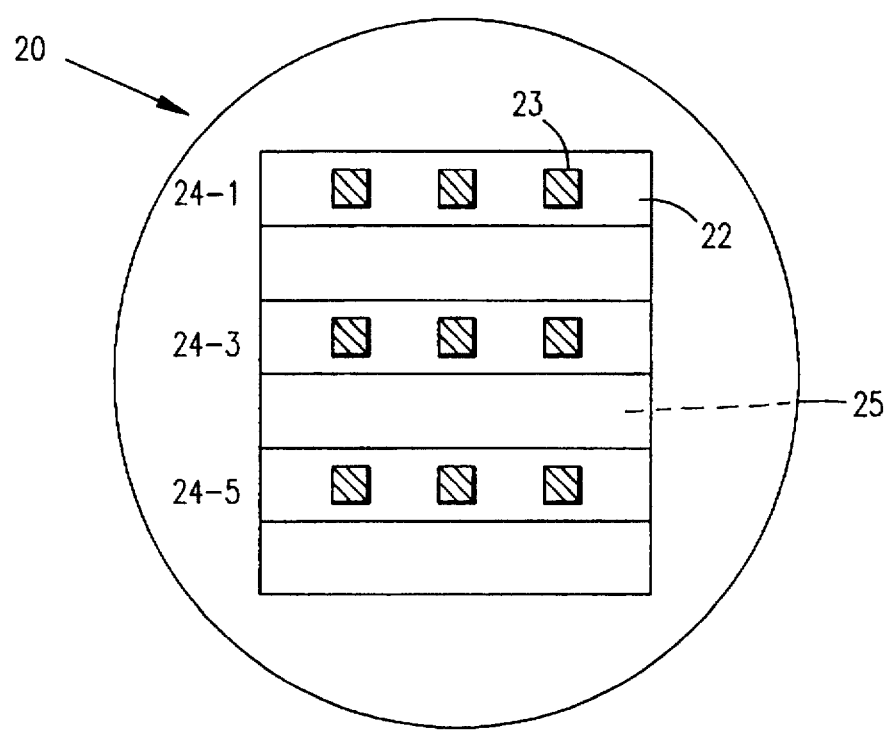
FIGS. 5A and 5B illustrate top views of a dual mask embodiment of the novel mask structure of the present invention.
Figure 5B:
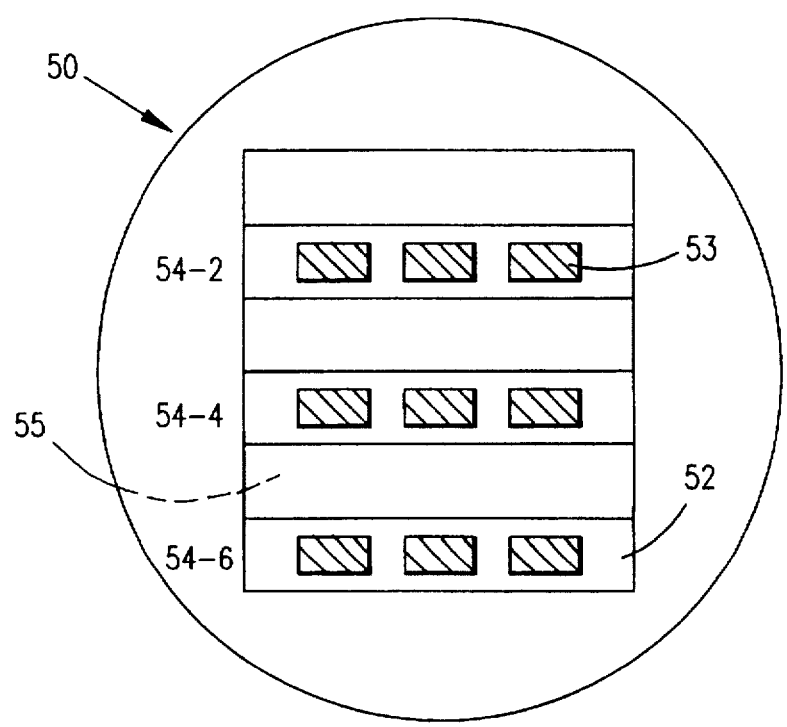

FIGS. 5A and 5B illustrate that the two-stage mask structure of FIGS. 3 and 4 can be divided into two separate patterned mask structures which may be used to sequentially expose areas of the semiconductor wafer, as detailed for the two-stage mask structure with reference to FIG. 6, or may be used in two distinct exposure processes, if desired. The mask structure, 20, of FIG. 5A has a membrane, 22, with absorbers, 23, located in rows, 24-1, 24-3 and 24-5, which correspond to the odd-numbered rows of the masks of FIG. 2 and FIGS. 3A and 4A. Interleaved with the rows, 24-1, 24-3 and 24-5 are support members, 25. The mask structure of FIG. 5B includes support members, 55, interleaved with rows 54-2, 54-4 and 54-6, which rows include sections of membrane, 52, with absorbers, 53. The two mask structures contain all of the mask features which are included in the previously-discussed masks and which are required for semiconductor processing. In use, as with the inventive mask structure discussed above, the semiconductor material to be patterned must be exposed through both masks in order to effect transfer of all of the desired mask features.

While the illustrated embodiments provides for alternating horizontal rows of membrane and absorbers with interleaved support members, it will be evident that the absorber pattern may be divided into vertical components or any other configuration which will insure that all of the features of the mask pattern have been accounted for and that any unsupported area of the membrane will be reduced in area to a degree sufficient to alleviate the negative pattern displacement effects of absorber stress on the membrane. Clearly, whatever configurations of membrane and absorbers are chosen must be replicated in the openings of the support structure and aligned therewith in assembly of the mask structure. In addition, while the present description provides for division of the mask features onto two stages or portions of the mask structure, or even two distinct mask structures, it will be apparent that more than two stages can be provided, once again insuring that all mask features are accounted for on at least one of the stages.

FIG. 6A through 6H illustrate use of the illustrated two-stage mask structure to expose three chip sites, 67–69 on a semiconductor wafer, 66. In the prior art during x-ray lithography, the mask, 10, of FIGS. 1 and 2 would be irradiated by scanning an x-ray beam across the membrane, 12. Such scanning would be accomplished either by sweeping the x-ray beam while keeping the mask and semiconductor wafer to be exposed stationary or by scanning the assembly of a mask and semiconductor wafer, fixed relative to each other, past a stationary x-ray beam. Full flood exposure, as is contemplated by several prior art sources, can also be used when applying the present invention. After one complete scan in the prior art, the complete chip area would have been exposed in all feature areas. The wafer would then be moved relative to the mask to achieve exposure on another wafer area.

Using the present inventive mask structure, however, exposure of one complete chip requires scanning the entire two-stage mask structure twice, with an intermediate displacement of the mask relative to the chip site on the wafer (or intermediate stepping of the wafer relative to the mask) by a distance equal to one original chip site dimension L. As such, the complete mask is scanned a first time, stepping is conducted, and then the complete mask is scanned a second time. If the mask pattern is divided into more than two stages, the equivalent number of scans would be required in order to expose all of the features.

FIGS. 6A, 6C, 6E and 6G provide a perspective view of the positions of the mask structure over the chip sites on the wafer at successive steps of the x-ray lithography. FIGS. 6B, 6D, 6F and 6H illustrate the exposure patterns at each chip site on the wafer after each successive exposure step, assuming for the sake of discussion that one could directly view the chip sites after each processing step, although such would not be a realistic possibility in practice. For the sake of illustration, three rows of mask features are indicated for mask 60, including rows 64-1, 64-2 and 64-3 which are alternately provided in the two mask stages.

Figure 6E:
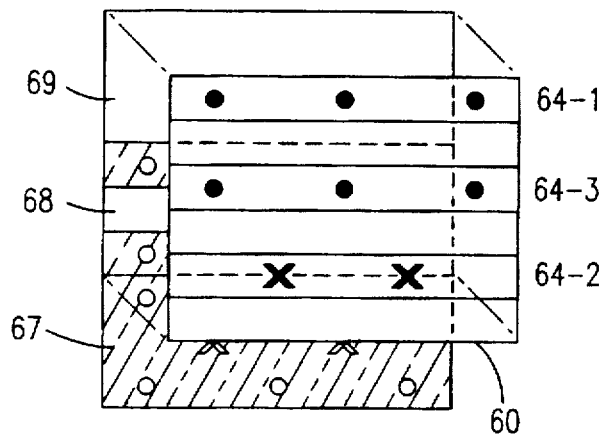
Figure 6F:
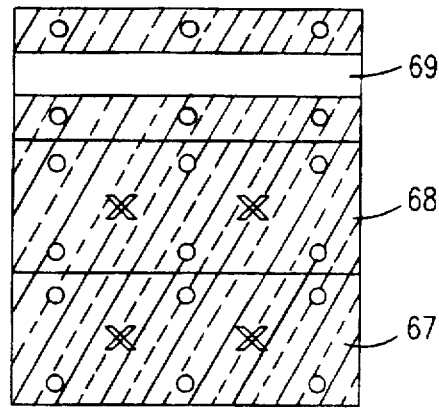
Figure 6G:
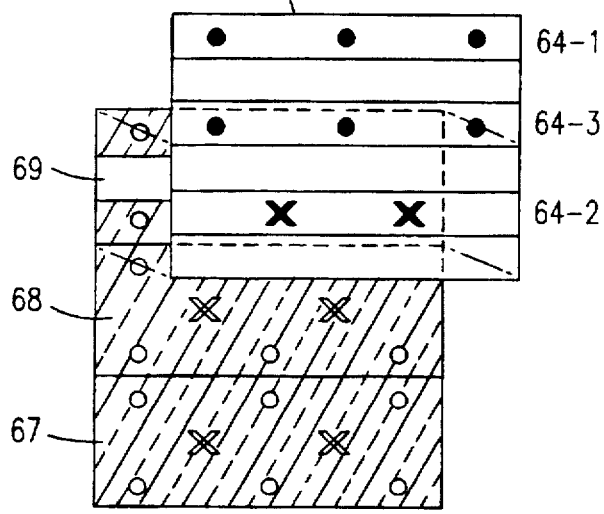
Figure 6H:
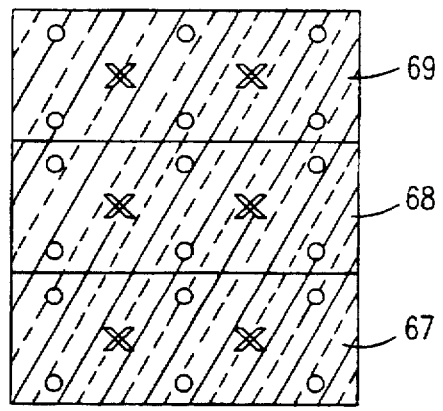

With specific reference to FIGS. 6A through 6H, the mask structure, 60, is initially positioned with the first mask stage including rows 64-1 and 64-3 over a first chip site, 67. After irradiation through the mask structure, 60, chip site 67 will contain an image of the membrane and absorber patterns from rows 64-1 and 64-3, as shown in FIG. 6B. Since the absorbers and the support members of the mask structure are opaque to the x-ray radiation, the exposed areas of chip site 67 will be those areas which were in alignment with the transparent membrane of rows 64-1 and 64-3. The mask structure, 60, is next stepped along one chip site dimension into position over chip sites 67 and 68, whereby the first mask stage including rows 64-1 and 64-3 is now positioned over chip site 68, while the second mask stage including row 64-2 is positioned over chip site 67, as shown in FIG. 6C. Upon irradiation of the chip sites, 67 and 68, through the mask structure, 60, the exposure patterns indicated in FIG. 6D result. All of the intended mask features have now been transferred to chip site 67, where the image sequence 64-1, 64-2, 64-3 is uninterrupted by blank areas, while chip site 68 bears the exposure pattern of the first mask stage including rows 64-1 and 64-3. Upon stepping of the mask, 60, to the position indicated in FIG. 6E, patterning of chip site 68 will be completed to include row 64-2, while chip site 69 will have transferred to it the patterns of rows 64-1 and 64-3, as illustrated in FIG. 6F. Finally, the mask structure, 60, will be moved into the position indicated in FIG. 6G whereby the second stage of the mask structure, containing row 64-2, is in position over chip site 69, while the first stage of the mask structure is beyond the edge of chip site 69. After irradiation with the mask structure in the position indicated by FIG. 6G, all of the chip sites have been fully patterned, as shown in FIG. 6H. The mask structure can then be stepped along an adjacent area of the wafer to pattern another series of chip sites.

As shown in FIGS. 3A and 3B, the width of the area of unsupported membrane between the two mask stages is equal to 2l, assuming that the mask will be stepped the full dimension of one chip site (i.e., 6l or L) between exposures. The area of supported membrane between the two mask stages of a two-stage mask can vary in width, provided that the distance stepped between exposures is correctly calibrated to align each of the mask stages over the semiconductor to ensure exposure of all desired features. As previously stated, the multiple stages of the mask structure could be provided in separate masks, with multiple complete iterations of the expose-and-step process flow. The latter method would clearly have a significant impact on the throughput of the wafer processing system, whereas use of a single two-stage mask would only require one additional exposure cycle, since two chip sites are being irradiated in a single cycle.

Figure 7:
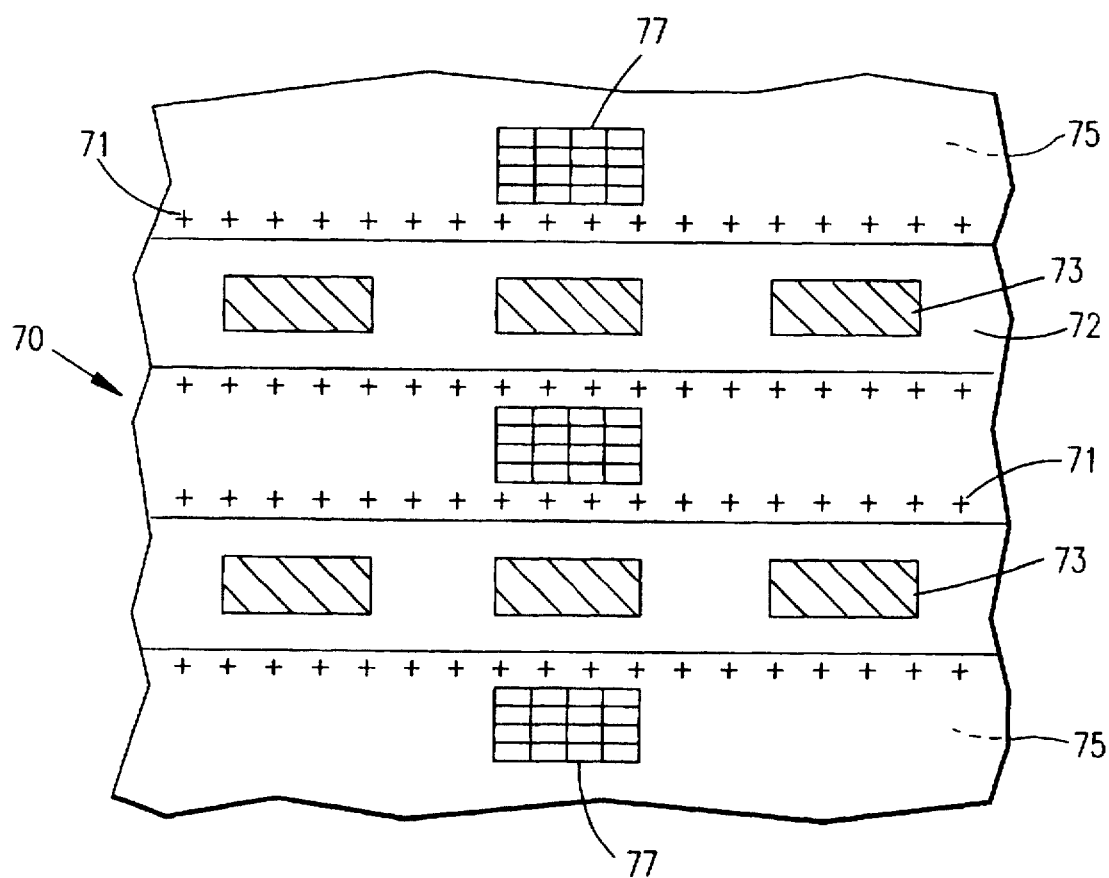
FIG. 7 illustrates, from the top view, the incorporation of irregular reference markers into the inventive mask structure.

FIG. 7 illustrates the incorporation of reference markers in the mask structure in order to provide for continual pattern alignment when the mask pattern is being written onto the mask. As previously mentioned, drift during the e-beam writing process can result in pattern displacement which will render the mask unusable for its intended purpose. Given the novel mask structure, as shown at 70 in FIG. 7, comprising areas having underlying support members, 75, interleaved with rows of unsupported membrane, 72, and absorbers, 73, inclusion of regularly-spaced reference markers is facilitated. Reference markers 71 can be provided in the x-ray opaque regions of the membrane which will be in alignment with the support members, or can be provided in the support members, since those regularly-spaced areas are opaque to the radiation and any markers placed thereon will not have any impact on the subsequent lithography. The choice of placement of the reference markers will be determined by the order of processing for fabrication of the mask, ensuring that the reference markers will be available to the e-beam writer during writing of the absorber features. It is contemplated that the most advantageous arrangement is to incorporate the reference markers into the mask wafer by either printing the markers onto the silicon using optical lithography or by creating a high precision ruler in the silicon by laser interferometry.

With the reference markers incorporated into the x-ray opaque regions of the mask wafer prior to the e-beam writing of the absorber mask pattern, the e-beam can lock onto the reference markers periodically during the writing process in order to instantaneously correct for drift errors which arise due to charging, vibration, etc., without having to interrupt the writing process to realign with a reference marker located far outside of the mask membrane area. FIG. 7 shows a dense configuration of reference markers, 71, for dynamic correction, since it will be most advantageous to have the e-beam writing proceed uninterrupted without the necessity of having to stop the writing process and refer back to any reference markers. High precision x,y, grid and focus correction patterns, 77, can also be incorporated into the x-ray opaque areas for use in calibrating the infield matching between major and minor deflection fields during writing, as well as to allow for dynamic corrections.

Figure 8A:
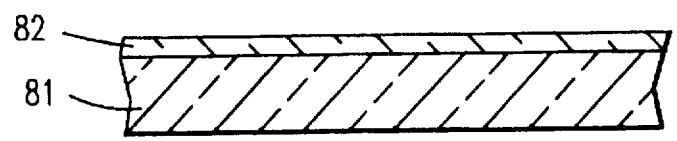
FIGS. 8A through 8D illustrate one process flow which can be employed for fabricating the novel mask structure.
Figure 8B:
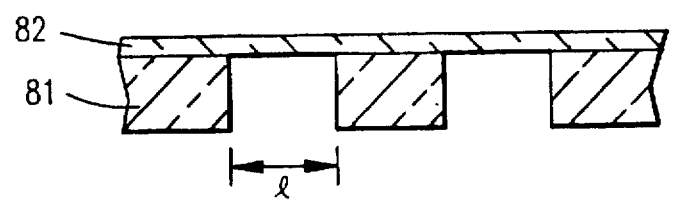
Figure 8C:
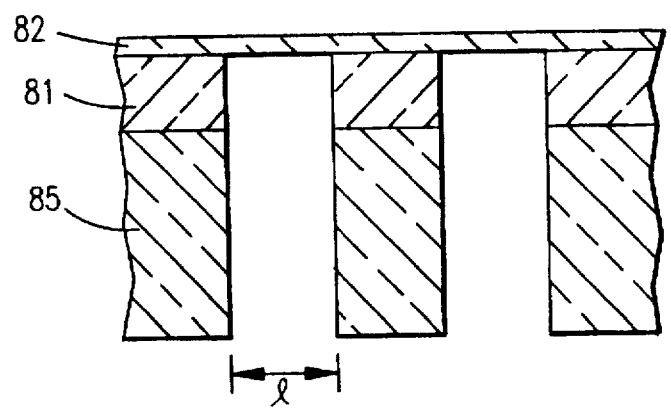
Figure 8D:
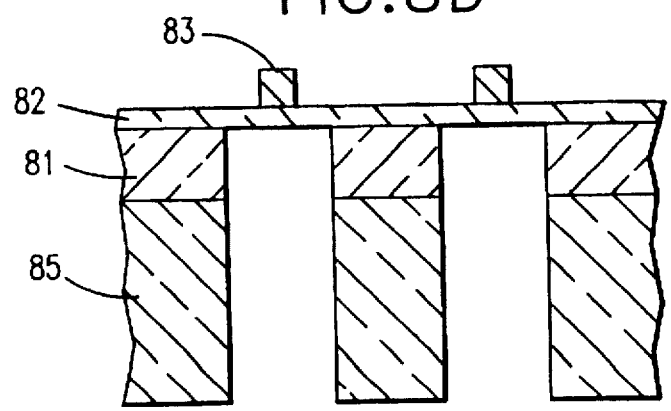

The remainder of the Figures refer to the processing of the mask structures themselves. FIGS. 8A through 8D indicate a mask processing flow wherein the membrane is formed in accordance with prior art mask processing. Membrane, 82, is created, either by diffusion into the substrate, 81, or by deposition of a thin layer onto the substrate, as shown in FIG. 8A, followed by etching of the substrate, 81, along dimension l to expose windows of the diffused or deposited membrane layer, 82, to yield the structure of FIG. 8B. Support members, 85, (or a wafer comprising a pattern of support members and windows) are then bonded to the substrate, 81, whereby the openings between the support members, 85, are aligned to the windows of dimension l in the substrate, 81. After the support members have been bonded to the substrate, absorbers, 83, are formed on the membrane, 82, in the areas defined by the windows in the substrate.

Figure 9A:
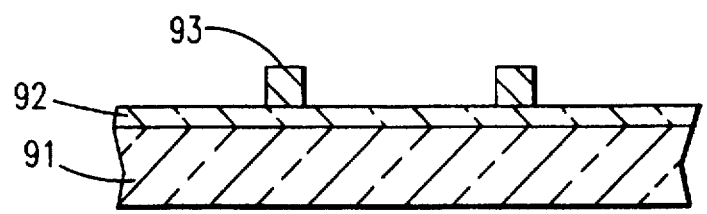
FIGS. 9A through 9C illustrate an alternative process flow for fabricating the novel mask structure.
Figure 9B:
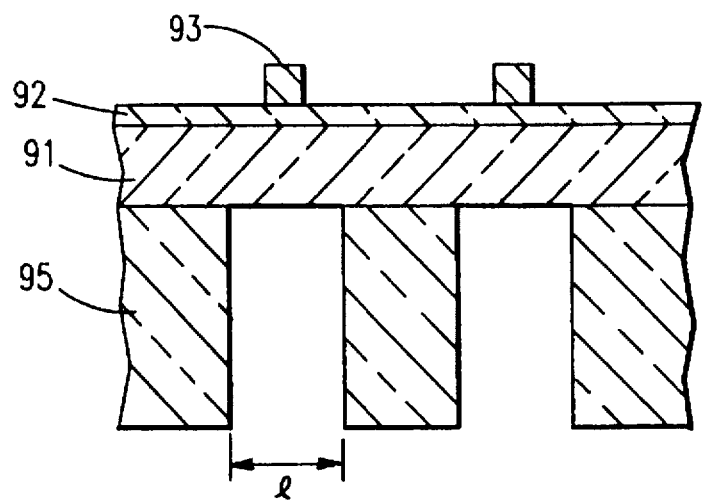
Figure 9C:
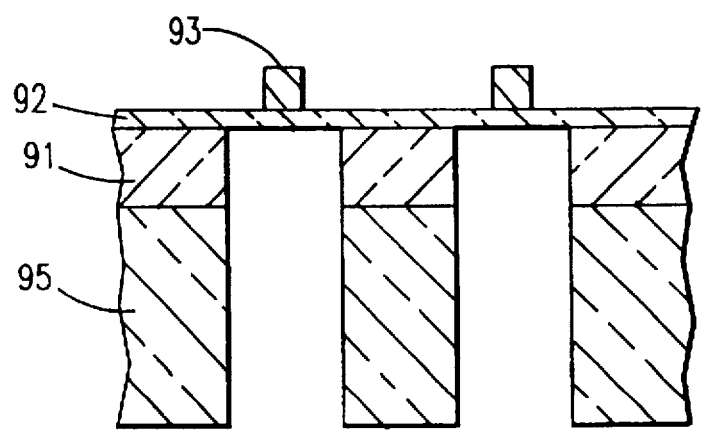

FIGS. 9A through 9C illustrate an alternative process flow to arrive at the same mask structure as above. The membrane material, 92, is formed on the substrate, 91, in accordance with known processing techniques, after which the absorbers, 93, are provided on the membrane, as shown in FIG. 9A. Support members 95, separated by openings of dimension l, are bonded to the substrate to yield the structure of FIG. 9B. Finally, the substrate, 91, is etched through the openings between the support members to expose the membrane, 92, in those areas at which the absorbers are located, as depicted in FIG. 9C.

Figure 10A:
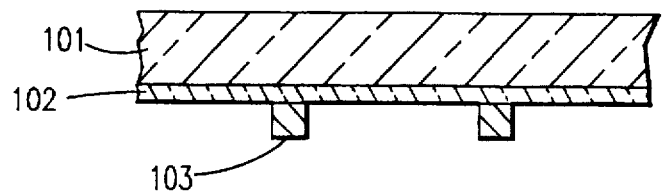
FIGS. 10A through 10D provide illustrations of yet another process flow for use in fabricating a preferred embodiment of the novel mask structure.
Figure 10B:
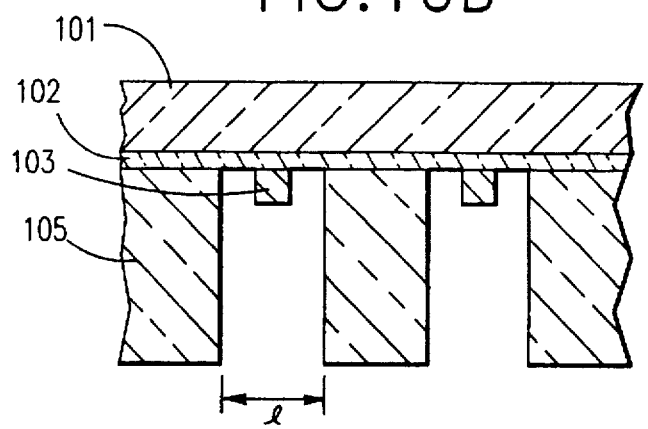
Figure 10C:
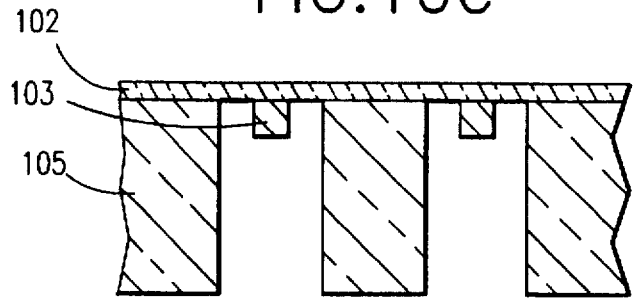

A method for fabricating one of the preferred embodiments of the inventive mask structure of the present invention is shown in FIGS. 10A through 10D. Fabrication of the substrate, 101, having a membrane material, 102, and absorbers 103 is conducted in accordance with the known techniques, to provide the structure of FIG. 10A. The structure of FIG. 10A is then flip-mounted and bonded to support members 105, so that the absorbers, 103, are located in the openings of dimension l between the support members 105 as shown in FIG. 10B. Substrate layer 101 can be removed, since it is no longer needed to provide any structural integrity to the mask membrane, as shown in FIG. 10C. By flip mounting the membrane and absorber arrangement, the absorber pattern will not be subject to physical harm (e.g., grazing against the semiconductor wafer) during use. Therefore, the life of the mask will be extended.

Figure 10D:
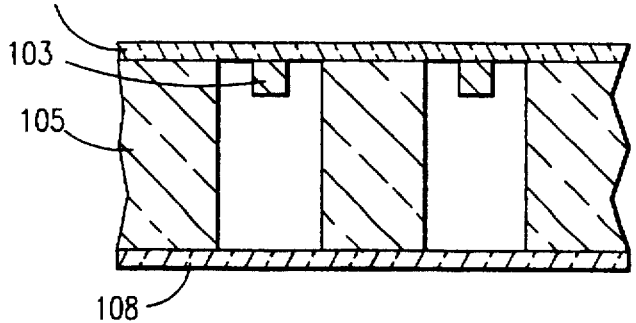

A disadvantage in the use of all masks during lithography is that debris including dust particles, foreign matter and residue from the irradiated resist material of the target semiconductor wafer can land on the mask, and interfere with proper printing and inspection of the mask. Cleaning of a mask having high resolution features can be extremely difficult, particularly when the debris collects in between the small gaps formed by the absorber pattern. Collected debris can lead to transfer of distorted features from the mask to the semiconductor. FIG. 10D illustrates the mask structure of FIG. 10C additionally including a protective pellicle, 108, over the support members 105. The pellicle is fabricated of material which is transparent to the irradiating source and which provides a planar surface onto which debris can collect. The debris can either be removed from the pellicle, or the pellicle replaced periodically. Silicon carbide is one material which would be suitable for use as a protective pellicle.

Figure 11A:
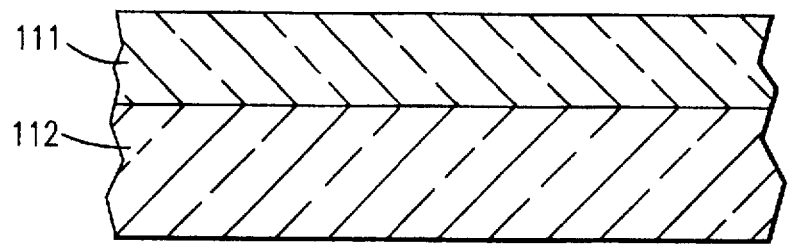
FIGS. 11A through 11F provide illustrations of an alternative process flow for use in fabricating a preferred embodiment of the novel mask structure.
Figure 11B:
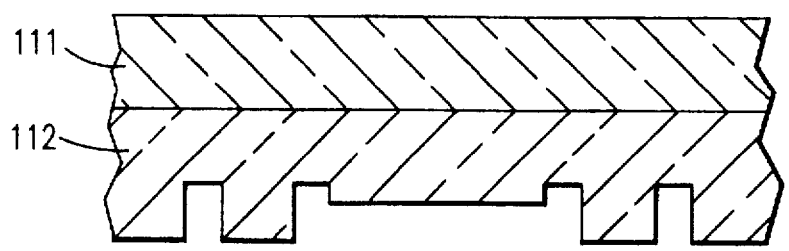
Figure 11C:
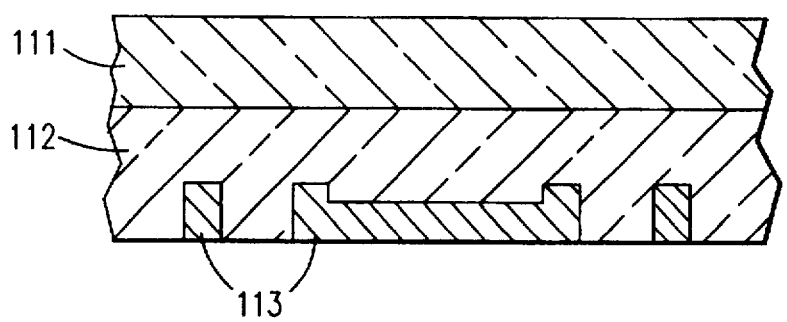
Figure 11D:
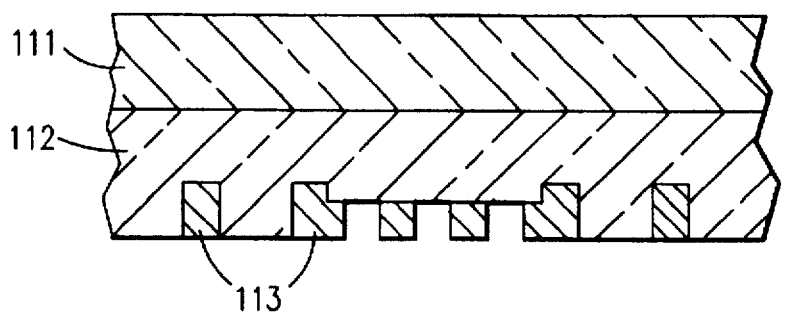
Figure 11E:
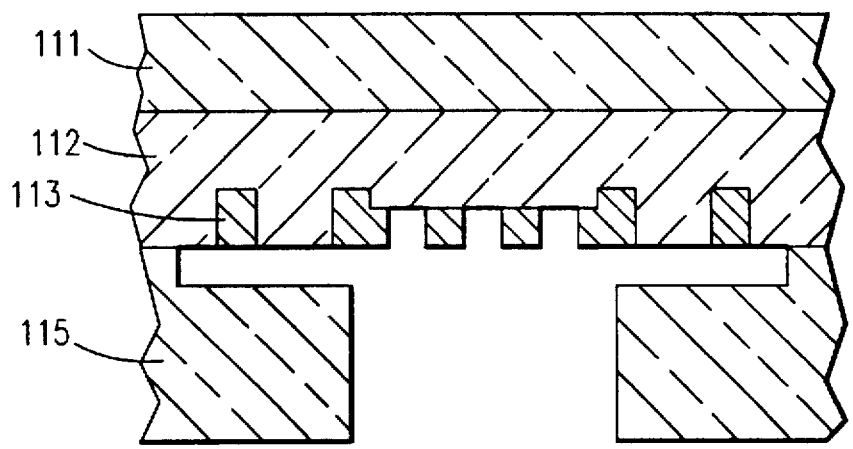
Figure 11F:
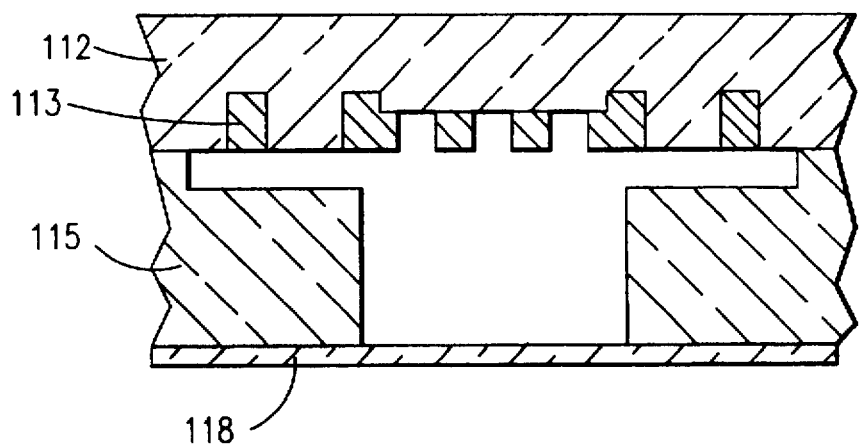

FIGS. 11A through 11F illustrate yet another process flow for fabricating a preferred embodiment of the present invention. In FIG. 11A, substrate 111 has a membrane material 112 provided thereon, by diffusion or deposition in accordance with known techniques. The membrane is etched, as shown in FIG. 11B, to provide interstices into which absorber metal will be deposited. Absorber material 113 is introduced into the membrane layer (e.g., by damascene processing of refractory metal fill followed by chemical-mechanical polishing or equivalent technique as will occur to one having skill in the art) as shown in FIG. 11C, followed by patterning of the absorber material (e.g., by deposition of a photoresist, selective patterning of the resist, reactive ion etching to transfer the pattern to the absorber, and removal of the resist) to yield the structure of FIG. 11D. The structure of FIG. 11D is then flip-mounted and bonded to support structure 115, as shown in FIG. 11E, as above, so that the pattern of absorbers is protected from physical harm by the surrounding support structure. Finally, the substrate, 111, is removed and pellicle 118 is bonded to the support structure to complete processing of the mask structure shown in FIG. 11F. As is apparent from the foregoing Figures, thicker absorber sections which are not part of the mask pattern and cut-away sections of the support members can be incorporated into the structure to facilitate alignment of the patterned mask wafer and the support wafer.

In all of the foregoing process flows, reference markers can first be formed in or on the support members prior to bonding of the support members to the substrate or to the membrane. The resulting mask structure and fabrication process provides for the following: significant reduction of in-plane distortion formerly caused by absorber stress; wafer processing with minimal post-processing distortion since the patterned mask will have smaller membrane window areas and will be reinforced by the support structure during many of the processing and post-processing steps; reduced distortion from radiation damage due to small windows areas; reduced distortion during use from thermal effects due to small window areas; protection of the absorber pattern to prevent accidental grazing of the pattern against the semiconductor wafer and accumulation of debris; protection of the absorber pattern by the transparent pellicle component of the mask structure; and, accurate mask absorber patterning due to incorporation of an array of reference markers in the support structure. While the present invention has been described with reference to specific materials and processes, one can modify the present invention in such manner as will occur to one having an ordinary level of skill in the art without departing from the spirit and scope of the invention as hereinafter claimed.

Having thus described our invention, what we claim as new and desire to secure by Letters Patent is:

1. A membrane mask for use in creating a pattern of mask features positioned on said membrane to an adjacent material by irradiating said material from a radiation source comprising:
   a plurality of mask membrane pattern sections including membrane areas of material transparent to said irradiating and each having less than all of said pattern of mask features of feature material opaque to said irradiating;
   a plurality of mask membrane support sections interleaved with said pattern sections, each of said plurality of support sections comprising membrane sections having underlaying support members of material opaque to said irradiating; and
   a plurality of e-beam reference markers provided at said mask membrane aligned to said support sections.

2. The mask of claim 1 wherein said mask features are provided at the upper surface of said membrane in said pattern sections.

3. The mask of claim 1 wherein said mask features are provided at the lower surface of said membrane in said pattern sections, between said support sections.

4. The mask of claim 3 further comprising a layer of material transparent to said radiation source provided at the surface of said support members not associated with said membrane sections.

5. The mask of claim 1 wherein said mask features are embedded in the lower surface of said membrane in said pattern sections, between said support sections.

6. A method for fabricating a membrane mask for use in creating a pattern of mask features in an adjacent material, by providing irradiation from a source to said material through said mask, comprising the steps of:
   providing a wafer of mask substrate material opaque to said irradiation;
   providing a layer of mask membrane material transparent to said irradiation at one surface of said mask substrate material;
   incorporating reference markers in said mask membrane material;
   providing a layer of feature material opaque to said irradiation on said mask membrane material;
   positioning an electron beam with reference to said reference markers;
   patterning said layer of feature material with said electron beam, thereby providing pattern features at the surface of said layer of mask membrane material;
   fastening a support structure to said patterned surface of said layer of mask membrane material, said support structure having support members interleaved with windows, whereby said pattern features on said mask membrane material are aligned with said windows; and
   removing said mask substrate material from said layer of mask membrane material.

7. The method of claim 6 wherein said providing of said layer of mask membrane material comprises depositing a layer of membrane material on said one surface of said mask substrate material.

8. The method of claim 6 wherein said providing of said layer of mask membrane material comprises diffusing a dopant into said one surface of said mask substrate material to form a layer of mask membrane material which is transparent to said irradiation.

9. The method of claim 6 wherein said providing of pattern features comprising embedding said feature material in said mask membrane material.

10. The method of claim 6 further comprising the step of applying a layer of material transparent to said irradiation at the surface of said support members not associated with said mask membrane material.

11. A method for fabricating a membrane mask for use in creating a pattern of mask features in a material, by providing irradiation from a source to said material through said mask, comprising the steps of:
   providing a wafer of mask substrate material opaque to said irradiation;
   providing a layer of mask membrane material at one surface of said mask substrate material, said mask membrane material being transparent to said irradiation;
   creating a plurality of e-beam reference markers at said layer of mask membrane material;
   providing pattern features at the surface of said mask membrane material, said pattern features comprising feature material opaque to said irradiation;
   fastening a support structure to said surface of said mask membrane material, said support structure having support members interleaved with said pattern features and wherein said e-beam reference markers are aligned to said support members; and removing said mask substrate material.

12. A method for fabricating a membrane mask for use in creating a pattern of mask features in a material, by providing irradiation from a source to said material through said mask, comprising the steps of:

providing a wafer of mask substrate material opaque to said irradiation;

providing a layer of mask membrane material at one surface of said mask substrate material, said mask membrane material being transparent to said irradiation;

creating a plurality of e-beam reference markers at said layer of mask membrane material;

providing pattern features at the surface of said mask membrane material, said pattern features comprising feature material opaque to said irradiation;

fastening a support structure to the surface of said mask substrate material opposite to said layer of mask membrane material, said support structure having support members interleaved with windows, whereby said windows are aligned to said pattern features and said e-beam reference markers are aligned to said support members; and etching said mask substrate material through said windows to expose said layer of mask membrane material having pattern features.

13. The method of claim 12 wherein said providing of said layer of mask membrane material comprises depositing a layer of membrane material on said one surface of said mask substrate material.

14. The method of claim 12 wherein said providing of said layer of mask membrane material comprises diffusing a dopant into said one surface of said mask substrate material to form a layer of mask membrane material which is transparent to said irradiation.

15. The method of claim 12 wherein said providing of said pattern features comprises the steps of:

providing a layer of feature material;

positioning an electron beam with reference to said e-beam reference markers; and patterning said feature material with said electron beam.

16. The method of claim 12 wherein said providing of pattern features comprising embedding said feature material in said mask membrane material.

17. The method of claim 12 further comprising the step of applying a layer of material transparent to said irradiation at the surface of said support members not associated with said mask membrane material.

18. A method for fabricating a membrane mask for use in creating a pattern of mask features in a material, by providing irradiation from a source to said material through said mask, comprising the steps of:

providing a wafer of mask substrate material opaque to said irradiation;

providing a layer of mask membrane material at one surface of said mask substrate material, said mask membrane material being transparent to said irradiation;

fastening a support structure to the surface of said mask substrate material opposite to said layer of mask membrane material, said support structure having support members interleaved with windows;

creating a plurality of e-beam reference markers at said layer of mask membrane material wherein said markers are aligned to said support members;

providing pattern features at the surface of said mask membrane material in areas of said mask membrane material which are in alignment with said windows, said pattern features comprising feature material opaque to said irradiation; and etching said mask substrate material through said windows to expose said layer of mask membrane material having pattern features.

19. The method of claim 18 wherein said providing of said layer of mask membrane material comprises depositing a layer of membrane material on said one surface of said mask substrate material.

20. The method of claim 18 wherein said providing of said of mask membrane material comprises diffusing a dopant into said one surface of said mask substrate material to form a layer of mask membrane material which is transparent to said irradiation.

21. The method of claim 18 wherein said providing of said pattern features comprises the steps of:

providing a layer of feature material;

positioning an electron beam with reference to said e-beam reference markers; and patterning said feature material with said electron beam.

22. The method of claim 18 wherein said providing of pattern features comprising embedding said feature material in said mask membrane material.

23. The method of claim 18 further comprising the step of applying a layer of material transparent to said irradiation at the surface of said support members not associated with said mask membrane material.

24. A method for fabricating a membrane mask for use in creating a pattern of mask features in an adjacent material, by providing irradiation from a source to said material through said mask, comprising the steps of:

providing a wafer of mask substrate material opaque to said irradiation;

providing a layer of mask membrane material at one surface of said mask substrate material, said mask membrane material being transparent to said irradiation;

creating a plurality of e-beam reference markers at said layer of mask membrane material;

fastening a support structure to the surface of said mask substrate material opposite to said layer of mask membrane material, said support structure having support members aligned to said reference markers and interleaved with windows;

etching said mask substrate material through said windows to expose said layer of mask membrane material in alignment with said windows; and providing pattern features at the surface of said mask membrane material in areas of said mask membrane material which are in alignment with said windows, said pattern features comprising feature material opaque to said irradiation.

25. The method of claim 24 wherein said providing of said layer of mask membrane material comprises depositing a layer of membrane material on said one surface of said mask substrate material.

26. The method of claim 24 wherein said providing of said layer of mask membrane material comprises diffusing a dopant into said one surface of said mask substrate material to form a layer of mask membrane material which is transparent to said irradiation.

27. The method of claim 24 wherein said providing of said pattern features comprises the steps of:
providing a layer of feature material;
positioning an electron beam with reference to said e-beam reference markers; and
patterning said feature material with said electron beam.

28. The method of claim 24 wherein said providing of pattern features comprising embedding said feature material in said mask membrane material.

29. The method of claim 24 further comprising the step of applying a layer of material transparent to said irradiation at the surface of said support members not associated with said mask membrane material.

30. A membrane mask for use in creating a pattern of mask features positioned on said membrane to an adjacent material by irradiating said material from a radiation source comprising:
a plurality of mask membrane pattern sections including membrane areas of material transparent to said irradiating and each having less than all of said pattern of mask features of feature material opaque to said irradiating;
a plurality of mask membrane support sections interleaved with said pattern sections, each of said plurality of support sections comprising membrane sections having underlaying support members of material opaque to said irradiating;
a plurality of e-beam reference markers provided at said mask membrane support sections; and
wherein said mask features are provided at the lower surface of said mask membrane between said support members.

31. The mask of claim 30 wherein said mask features are embedded in said lower surface of said mask membrane.

32. The mask of claim 30 further comprising a layer of material transparent to said radiation source provided at the surface of said support members not associated with said membrane sections.

33. The mask of claim 30 wherein said underlying support members are recessed to provide alignment and avoid overexposure of areas bordering said mask pattern sections.

* * * * *